(12) United States Patent
Garni

(10) Patent No.: US 7,038,959 B2
(45) Date of Patent: May 2, 2006

(54) MRAM SENSE AMPLIFIER HAVING A PRECHARGE CIRCUIT AND METHOD FOR SENSING

(75) Inventor: Bradley J. Garni, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 14 days.

(21) Appl. No.: 10/943,579

(22) Filed: Sep. 17, 2004

(65) Prior Publication Data

US 2006/0062066 A1    Mar. 23, 2006

(51) Int. Cl.
G11C 7/00 (2006.01)

(52) U.S. Cl. .............. 365/203; 365/204; 365/207; 365/210

(58) Field of Classification Search .......... 365/189.09, 365/203, 204 X, 207 X, 210 X
See application file for complete search history.

(56) References Cited

U.S. PATENT DOCUMENTS

| | | | |
|---|---|---|---|
| 5,703,820 A | 12/1997 | Kohno | |
| 5,872,739 A * | 2/1999 | Womack | 365/207 |
| 6,094,394 A * | 7/2000 | La Rosa | 365/207 |
| 6,185,143 B1 | 2/2001 | Perner et al. | |
| 6,191,989 B1 | 2/2001 | Luk et al. | |
| 6,256,247 B1 | 7/2001 | Perner | |
| 6,473,350 B1 | 10/2002 | Lee | |
| 6,538,940 B1 * | 3/2003 | Nahas et al. | 365/201 |
| 6,600,690 B1 | 7/2003 | Nahas | |
| 2001/0012228 A1 | 8/2001 | Perner | |
| 2002/0054503 A1 | 5/2002 | Lee | |
| 2003/0020097 A1 | 1/2003 | Lee | |

* cited by examiner

Primary Examiner—Van Thu Nguyen
(74) Attorney, Agent, or Firm—Daniel O. Hill

(57) ABSTRACT

A sense amplifier (11) and method for sensing a MRAM cell (77) is provided. The sense amplifier (11) includes a precharge circuit (13') having an operational amplifier (40, 42) that uses a voltage divider (115, 116) in a feedback path to control the amount of charge stored on a capacitor (104, 105). During a precharge portion of a read operation, the charge stored on the capacitor (104, 105) is used to precharge the sense amplifier (11). By using charge sharing to precharge the sense amplifier (11), the sense amplifier (11) can be precharged to a steady state common mode voltage more quickly, thus decreasing time required for a read operation.

27 Claims, 3 Drawing Sheets

FIG. 1 –PRIOR ART–

MRAM SENSE AMPLIFIER HAVING A PRECHARGE CIRCUIT AND METHOD FOR SENSING

FIELD OF THE INVENTION

This invention relates to Magnetoresistive Random Access Memories (MRAMs), and more particularly to a precharge and equalization circuit for an MRAM sense amplifier and method for sensing.

BACKGROUND OF THE INVENTION

Non-volatile memory devices, such as FLASH memories, are important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

Storing data is accomplished by applying magnetic fields and causing a magnetic material in a MRAM device to be magnetized into either of two possible memory states. Reading data stored in the memory is accomplished by sensing differences in tunnel junction resistance in the MRAM cells between the two states. Typically, the stored state of a memory cell can be determined by comparing the cell state to that of a reference cell. However, the difference in resistance between a high state and a low state can be very small, and provide a worst case current difference of 0.5 micro amperes or less, requiring a sense amplifier with high sensitivity. Also, the sense amplifier should provide for a fast read operation. Therefore, there is a need for a sense amplifier with small signal detection capability and provides for a fast read operation in a MRAM.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Generally, the present invention provides a sense amplifier and method for sensing a MRAM cell. The sense amplifier includes a precharge circuit that has an operational amplifier. The operational amplifier includes a voltage divider in its feedback path to control the amount of charge stored on a capacitor. During a precharge portion of a read operation, the charge stored on the capacitor is used to precharge the sense amplifier. A reference circuit defines a precharge voltage to which the sense amplifier is charged. By using charge sharing to precharge the sense amplifier, the sense amplifier can be precharged to a steady state common mode voltage more quickly, thus reducing the time for a read operation.

Figure 1:
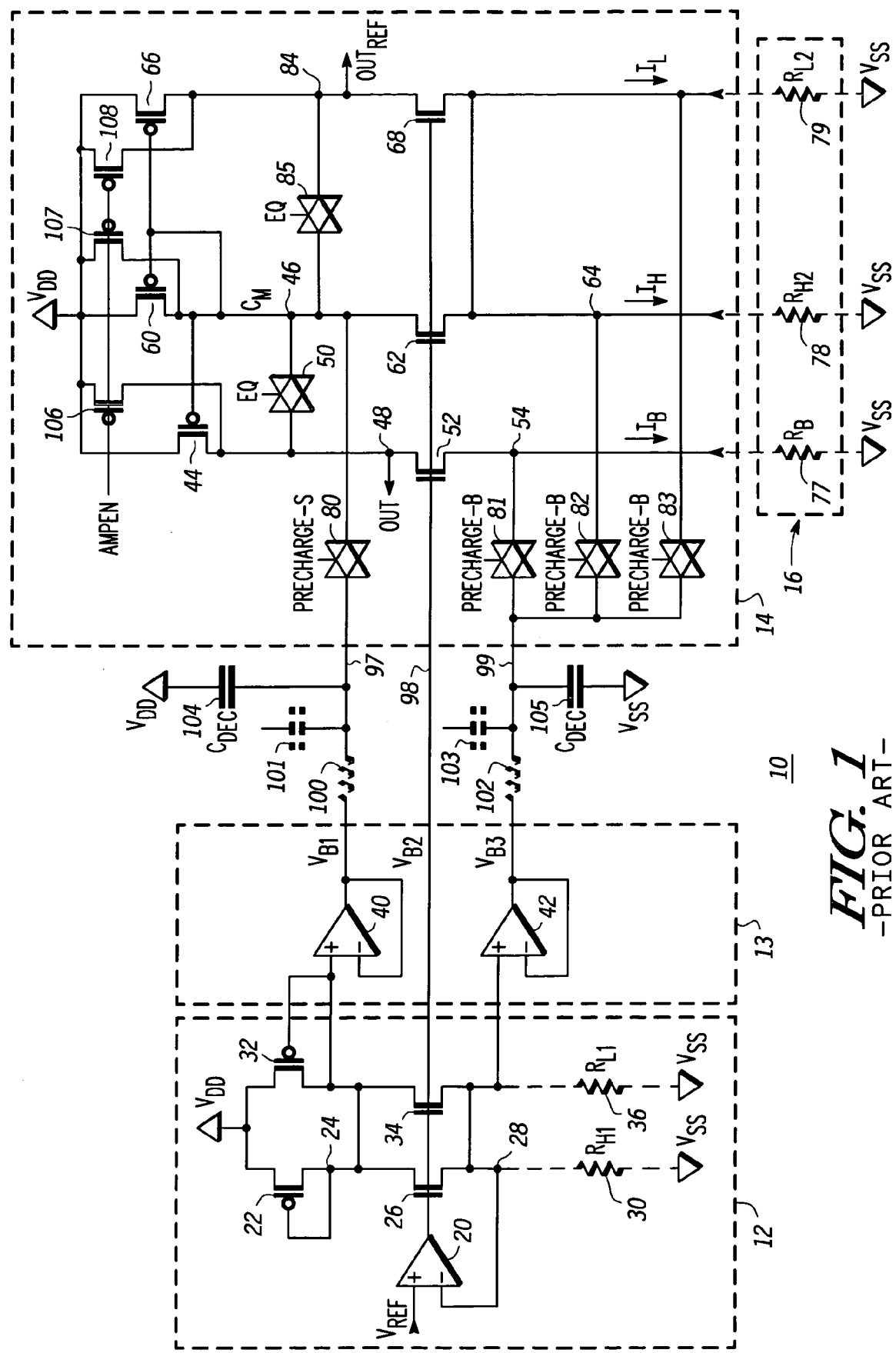
FIG. 1 illustrates, in schematic diagram form, a prior art MRAM sense amplifier.

FIG. 1 illustrates, in schematic diagram form, a prior art MRAM sense amplifier 10. The MRAM sense amplifier 10 includes a reference circuit 12, a precharge circuit 13, and a sense circuit 14. The reference circuit 12 includes operational amplifier 20, P-channel transistors 22 and 32, N-channel transistors 26 and 34, and reference cells 30 and 36. Resistance values of reference cells 30 and 36 are represented in FIG. 1 by resistances $R_{H1}$ and $R_{L1}$, respectively. The precharge circuit 13 includes operational amplifiers 40 and 42. The sense circuit 14 includes transmission gates 50, 80, 81, 82, 83, and 85, P-channel transistors 44, 60, 66, 106, 107, and 108, and N-channel common gate transistors 52, 62, and 68. An array portion 16 includes memory cells 77, 78, and 79. The resistance values of memory cells 77, 78, and 79 are represented in FIG. 1 by resistances $R_B$, $R_{H2}$, and $R_{L2}$, respectively. P-channel transistors 44, 60, and 66 are coupled to provide a current mirror circuit for sense circuit 14. P-channel transistors 106, 107, and 108 are coupled to provide an enable circuit for sense circuit 14.

The precharge circuit 13 is coupled to the sense circuit 14 using conductors 97, 98, and 99. In a memory having sense amplifier 10, there would be many sense circuits similar the sense circuit 14. However, only one reference circuit 12 and only one precharge circuit 13 are implemented on an integrated circuit to provide a precharge voltage to all of the sense circuits. Note that, in another embodiment, more than one reference circuit 12 and/or precharge circuit 13 may be desirable. Because of the relatively long conductors needed to couple the precharge circuit 13 to the many sense circuits, a parasitic resistance and capacitance of the conductors may become significant, as represented by the resistors 100 and 102 and by the capacitors 101 and 103 coupled to conductors 97 and 99 (drawn with dashed lines to show they are parasitic). In addition, decoupling capacitors 104 and 105 are coupled to the conductors 97 and 99.

In reference circuit 12, the P-channel transistor 22 has a first current electrode (source/drain) coupled to a power supply voltage terminal labeled "$V_{DD}$", and a control electrode (gate) and a second current electrode (source/drain) coupled together at a node 24. In the illustrated embodiment, the transistors are implemented using complementary metal-oxide semiconductor (CMOS) technology. In other embodiments, the transistors may be implemented using a different technology. The P-channel transistor 32 has a source coupled to $V_{DD}$, and a gate and drain coupled to the gate and drain of P-channel transistor 22 at the node 24. The N-channel transistors 26 and 34 have drains coupled to the node 24, gates coupled together, and sources coupled to a node 28. The operational amplifier 20 has a first, non-inverting, input coupled to receive a reference voltage labeled "$V_{REF}$", a second, inverting, input coupled to the node 28, and an output for providing a voltage labeled "$V_{B2}$" to the gates of transistors 26 and 34. The reference cell 30 has a first terminal coupled to the node 28, and a second terminal coupled to a power supply voltage terminal labeled "$V_{SS}$". The reference cell 36 has a first terminal coupled to the node 28, and a second terminal coupled to $V_{SS}$.

In precharge circuit 13, the operational amplifier 40 has a first, non-inverting, input coupled to the node 24, and a second, inverting, input coupled to an output of operational amplifier 40. The output of amplifier 40 is for providing a precharge voltage labeled "$V_{B1}$" to the conductor 97. The operational amplifier 42 has a first, non-inverting, input coupled to the node 28, and a second, inverting, input coupled to the output of operational amplifier 42. The output of amplifier 42 is for providing a precharge voltage labeled "$V_{B3}$" to the conductor 99.

In the sense circuit 14, the P-channel transistor 106 has a source coupled to $V_{DD}$, a gate, and a drain coupled to a node 48. The P-channel transistor 107 has a source coupled to $V_{DD}$, a gate, and a drain coupled to a node 46. The P-channel transistor 108 has a source coupled to $V_{DD}$, a gate, and a drain coupled to a node 84. The nodes 46, 48, and 84 have capacitances associated with them labeled "$C_M$," "$C_O$," and "$C_{OR}$", respectively. The gates of the transistors 106, 107, and 108 receive a sense amplifier enable signal labeled "AMPEN".

P-channel transistor 44, N-channel transistor 52, and memory cell 77 provide a first current path of the sense circuit 14 for conducting a current labeled "$I_B$" through memory cell 77. P-channel transistor 60, N-channel transistor 62, and reference cell 78 provide a second current path of the sense circuit 14 for conducting a reference current labeled "$I_H$" through reference cell 78. P-channel transistor 66, N-channel transistor 68, and reference cell 79 provide a third current path of the sense circuit 14 for conducting a reference current labeled "$I_L$" through reference cell 79. In the first current path, P-channel transistor 44 has a source coupled to $V_{DD}$, a gate coupled to the node 46, and a drain coupled to the node 48. A memory cell output voltage labeled "OUT" is provided at node 48. N-channel transistor 52 has a drain coupled to the node 48, a gate coupled to the conductor 98, and a source coupled to a node 54. Memory cell 77 is illustrated as a resistor and has a first terminal coupled to the node 54, and a second terminal coupled to $V_{SS}$. One skilled in the art will recognize that there would be other circuit elements in the current paths that are not illustrated in FIG. 1, such as for example, column decoding circuits. Also, the reference circuit 12 and the precharge circuit 13 may include other circuit elements as needed to duplicate the paths of the sensing circuit. The other circuit elements are not needed for purposes of describing the operation of sense circuit 14 and have been omitted for the purpose of brevity. In the second current path, P-channel transistor 60 has a source coupled to $V_{DD}$, a gate coupled to the node 46, and a drain coupled to the node 46. N-channel transistor 62 has a drain coupled to the node 46, a gate coupled to the conductor 98, and a source coupled to the node 64. The reference cell 78 has a first terminal coupled to the node 64, and a second terminal coupled to $V_{SS}$. In the third current path, P-channel transistor 66 has a source coupled to $V_{DD}$, a gate coupled to the node 46, and a drain coupled to the node 84. A reference output voltage labeled "$OUT_{REF}$" is provided at the node 84. N-channel transistor 68 has a drain coupled to the node 84, a gate coupled to the conductor 98, and a source coupled to the node 64. The reference cell 79 has a first terminal coupled to the node 64, and a second terminal coupled to $V_{SS}$. The reference cells 78 and 79 are implemented as normal MRAM cells except that reference cell 78 is programmed to have a resistance $R_{H2}$ that is equal to the resistance of a normal memory cell that is storing a logic high and reference cell 79 is programmed to have a resistance $R_{L2}$ that is equal to the resistance of a normal memory cell that is storing a logic low.

The transmission gate 80 has a first terminal coupled to the conductor 97, a second terminal coupled to the node 46, and a control terminal for receiving a precharge control signal labeled "PRECHARGE-S". The transmission gates 81, 82, and 83 each have a first terminal coupled to the conductor 99. A second terminal of transmission gate 81 is coupled to the node 54. A second terminal of transmission gate 82 is coupled to the node 64. A second terminal of transmission gate 83 is coupled to the node 64. Control terminals of each of transmission gates 81, 82, and 83 receive a precharge control signal labeled "PRECHARGE-B".

The transmission gate 50 has a first terminal coupled to the node 48, and a second terminal coupled to the node 46. The transmission gate 85 has a first terminal coupled to the node 46, and a second terminal coupled to the node 84. Control terminals of the transmission gates 50 and 85 receive an equalization signal labeled "EQ".

In operation, sense amplifier 10 senses a state of a memory cell, represented by resistance 77, that is programmable to either a high logic state or a low logic state. A bit, a high reference, and a low reference are accessed in sense amplifier 10 by an address and a decoder (not shown). For memories such as an MRAM, the high reference cell is a cell programmed to a distinct high resistance memory state $R_{H2}$ as represented by resistance 78. Similarly, the low reference is a cell programmed to a distinct low resistance memory state $R_{L2}$ as represented by resistance 79. The bit is an addressed cell whose memory state RB represented by resistance 77 could be either a high (represented by a high resistance state) or a low (represented by a low resistance state). Note that pass transistors (not shown) may exist between each of transistors 52, 62, and 68 and the associated coupled memory cell so that the resistances 77, 78, and 79 each represent a cumulative resistance associated with accessing the associated memory cell. Similarly, pass transistors may exist between the resistances 77, 78, and 79 and the $V_{SS}$ voltage terminal.

Reference circuit 12 in combination with precharge circuit 13 will generate three specific bias voltages to control sense circuit 14. Sense circuit 14 uses a common gate voltage, $V_{B2}$, to bias the transistors 52, 62, and 68. The biasing of transistors 52, 62, and 68 places a substantially same bias voltage across resistances $R_B$, $R_{H2}$, and $R_{L2}$ that is close to a transistor threshold below $V_{B2}$. This biasing establishes saturated current levels for each of transistors 52, 62, and 68 that is represented as $I_B$, $I_H$, and $I_L$. The values of $I_B$, $I_H$, and $I_L$ are close to the substantially same bias voltage placed across them divided by the total effective resistance associated with accessing $R_B$, $R_{H2}$ and $R_{L2}$, respectively. In the illustrated form, transistors 60 and 66 are connected in a manner that averages $I_H$ and $I_L$ thereby establishing a current through each of transistors 60 and 66 equal to $(I_H+I_L)/2$. The biasing of transistors 60 and 66 establishes a reference voltage $OUT_{REF}$ at node 84. Connecting the gate of transistor 44 at node 46 to the gates of transistors 60 and 66 establishes as a current mirror a saturated current level for transistor 44 that is also equal to $(I_H+I_L)/2$. The voltage at node 48, the output (OUT), will then reflect the difference between the saturated current $(I_H+I_L)/2$ conducted by transistor 44 and the saturated current $I_B$ conducted by transistor 52. For an $R_B$ with a low resistance state, the steady state voltage value of the OUT signal at node 48 will be lower in potential than the reference voltage $OUT_{REF}$. For an $R_B$ with a high resistance state, the steady state voltage value of the OUT signal at node 48 will be higher in potential than the reference voltage $OUT_{REF}$.

Reference circuit 12 receives a reference input voltage, $V_{REF}$, and uses $R_{H1}$ and $R_{L1}$ to provide the illustrated precharge and bias voltages to sense circuit 14. In operation, $V_{B2}$ is controlled by operational amplifier 20 to maintain a voltage equal to the $V_{REF}$ input voltage on node 28. Two reference memory cells, $R_{H1}$ and $R_{L1}$, are coupled to node 28. The $R_{H1}$ resistance is a memory cell having a high resistance state and the $R_{L1}$ resistance is a memory cell having a low resistance state. The connection of $R_{H1}$ and $R_{L1}$ with the inverting input of operational amplifier 20 along with transistors 26 and 34 being sized substantially equal to the size of transistors 52, 62, and 68 results in the establishment of a voltage $V_{B2}$ that creates steady state voltages in sense amplifier 14 that are substantially equal to the $V_{REF}$ value. In particular, the steady state voltages are the voltages at nodes 28, 54, and 64.

The voltage $V_{B3}$ provided by operational amplifier 42 is used to precharge nodes 54 and 64 to a value close to their steady state values. By using transistors 22 and 32 substantially of the same size as transistors 44, 60 and 66, operational amplifier 40 provides a voltage $V_{B1}$ that is used to precharge nodes 46, 48, and 84 in sense amplifier 14 to a value close to their steady state value.

Reference circuit 12 and precharge circuit 13 function to adjust the voltages $V_{B1}$, $V_{B2}$ and $V_{B3}$ over temperature, supply voltage, and process variations. The tracking in voltage values between reference circuit 12 and sense circuit 14 is in part due to the intentional device size matching of transistors in reference circuit 12 with transistors in sense circuit 14 and use of reference resistances $R_{H1}$ and $R_{L1}$.

When not being used to sense the logic state of memory cells, sense circuit 14 is turned off with the aid of the relatively small P-channel transistors 106, 107, and 108 when sense amplifier enable signal AMPEN is a logic low voltage. The internal nodes 46, 48, and 84 are pulled up to VDD. This insures that the sense circuit 14 remains off and that the sensing operation always starts from the same initial condition.

Preparatory to sensing the state of a memory cell during a read operation, the enable signal AMPEN switches to a high state enabling the sensing circuit 14. The reference circuit 12 and the precharge circuit 13 cause the voltages of nodes 46, 48, and 84 to transition to near their steady state common mode voltages. At the same time the voltages on nodes 54 and 64 transition to near their steady state common mode voltages resulting in the sense amplifier being precharged. Then, during a read operation, the difference between the resistance of a memory cell, such as memory cell 77, and the resistance of parallel reference cells, such as reference cells 78 and 79, will cause the voltages on nodes 48 and 84 to separate, thus indicating the logic state stored in the cell. Note that those skilled in the will recognize that in other embodiments the resistance of memory cell 77 may be compared to only one reference cell having a mid-level resistance.

Because the sense circuit 14 must have a relatively high sensitivity, the transistors are sized relatively large to reduce the amount of transistor mismatch. The amount of transistor mismatch decreases with decreasing aspect ratio. However, the use of larger transistors will also increase the period of time required to precharge the nodes and will increase the required capacitance of decoupling capacitances 104 and 105 to accurately precharge the sense circuit 14 to near steady state common mode voltages.

Figure 2:
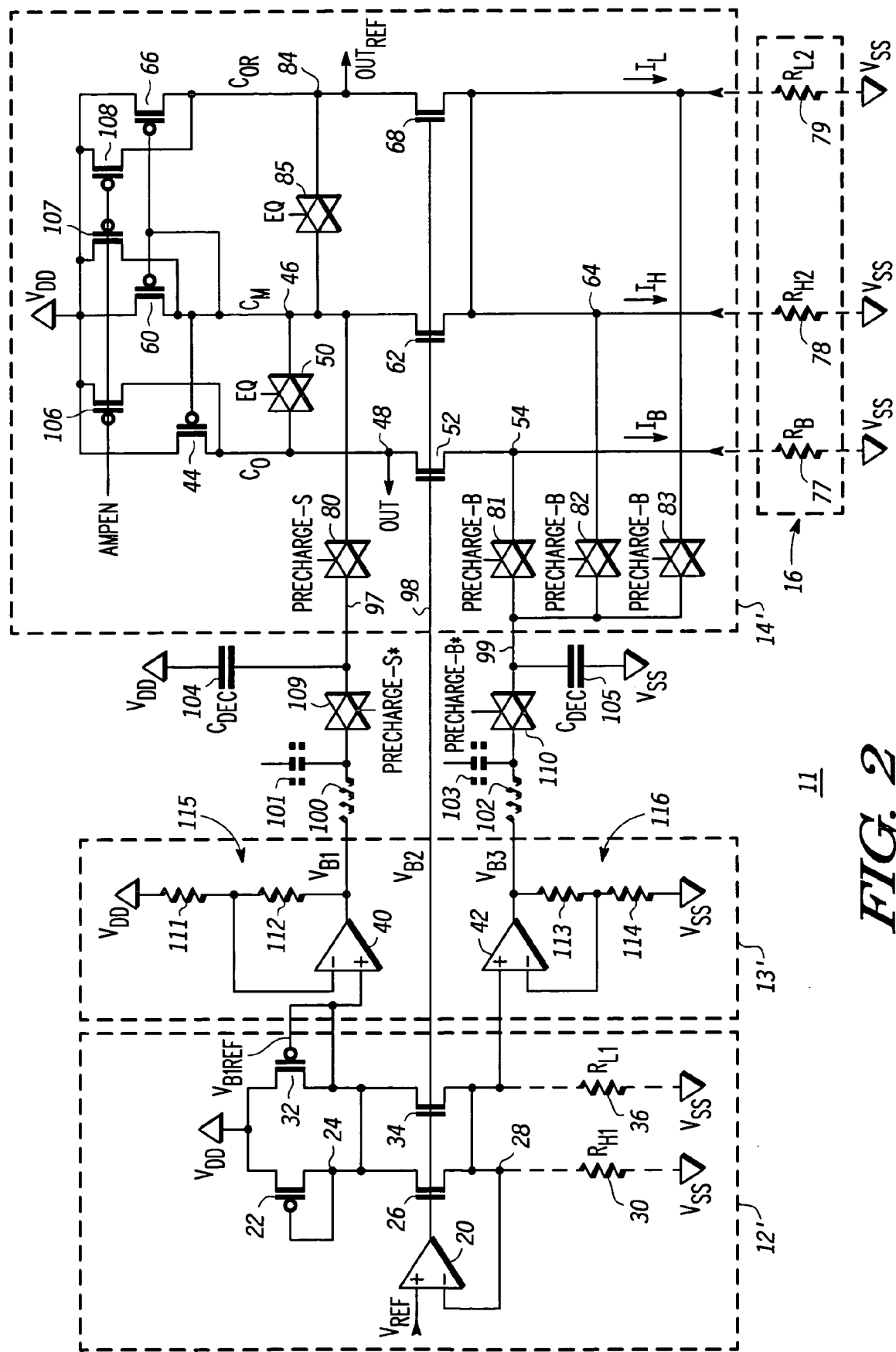
FIG. 2 illustrates, in schematic diagram form, a MRAM sense amplifier in accordance with one embodiment of the present invention.

FIG. 2 illustrates, in schematic diagram form, a MRAM sense amplifier 11 in accordance with one embodiment of the present invention. For convenience of illustration, the same reference numbers will be used to identify the same or similar elements commonly illustrated between the FIGS. 1 and 2. Memory 11 differs from memory 10 in that the conductor 97 includes an additional transmission gate 109 controlled by a precharge signal labeled "PRECHARGE-S*". Also, the conductor 99 includes an additional transmission gate 110 controlled by a precharge signal labeled "PRECHARGE-B*". In addition, memory 11 differs from memory 10 in that a voltage divider circuit is included in the feedback path of operational amplifiers 40 and 42. For illustration purposes, the operational amplifiers have been included as part of a precharge circuit 13' coupled to a reference circuit 12'. A voltage divider 115 associated with amplifier 40 includes resistors 111 and 112. The resistor 111 has a first terminal coupled to $V_{DD}$, and a second terminal coupled to the first input of amplifier 40. The resistor 112 has a first terminal coupled to the second terminal of resistor 111, and a second terminal coupled to the output of amplifier 40. A voltage divider 116 associated with amplifier 42 includes resistors 113 and 114. The resistor 113 has a first terminal coupled to the output of amplifier 42, and a second terminal coupled to the second input of amplifier 42. The resistor 114 has a first terminal coupled to the second terminal of resistor 113, and a second terminal coupled to $V_{SS}$. Note that precharge signal PRECHARGE-S* is a logical complement of PRECHARGE-S and precharge signal PRECHARGE-B* is a logical complement of precharge signal PRECHARGE-B.

The operation of reference circuit 12' is the same as the operation of reference circuit 12 of FIG. 1. Also, in general, the operation of sense circuit 14' is the same as the operation of sense circuit 14. Therefore, the above description of reference circuit 12 and sense circuit 14 also applies to the description of reference circuit 12' and sense circuit 14' and will not be repeated in the description of FIG. 2. The precharge operation, as illustrated in the embodiment of FIG. 2, will be discussed with reference to the precharging of nodes 46, 48, and 84. The precharge operation of nodes 54 and 64 is similar.

Figure 3:
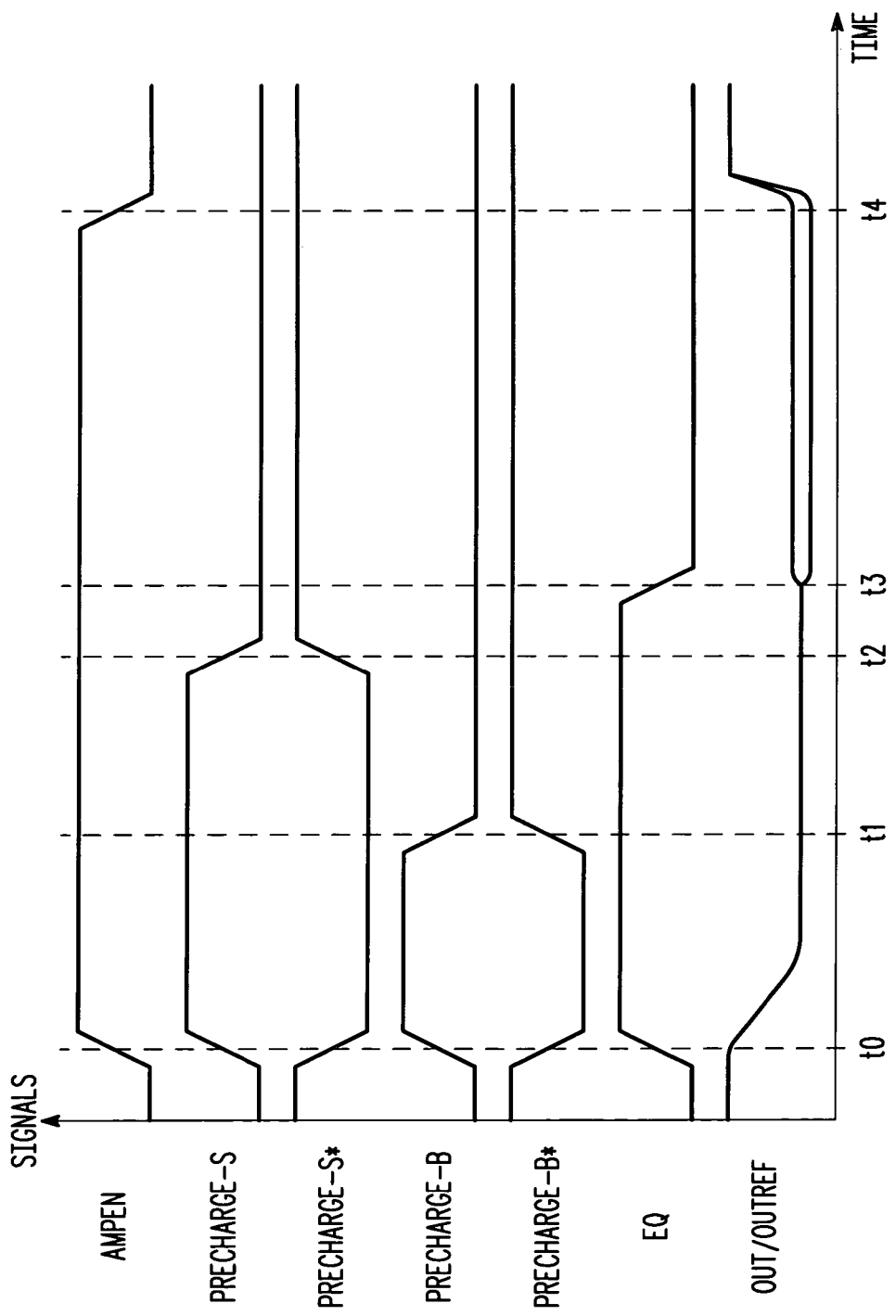
FIG. 3 is a timing diagram of various signals useful for understanding a read operation of the sense amplifier of FIG. 2.

The precharge operation of nodes 46, 48, and 84 will be discussed by referring to both FIG. 2 and FIG. 3. FIG. 3 is a timing diagram of various signals useful for understanding a read operation of the sense amplifier of FIG. 2. The precharge operation begins with the charging of capacitor 104. Before time t0 of FIG. 3, PRECHARGE-S is a logic low and PRECHARGE-S* is a logic high, causing transmission gate 80 to be non-conductive and transmission gate 109 to be conductive. The capacitor 104 is precharged with the voltage provided by the output of operational amplifier 40. The ratio of resistances of resistors 111 and 112 determines the output voltage of operational amplifier 40.

Prior to precharging, the nodes, 46, 48, and 84 are at $V_{DD}$. During steady state the nodes 46, 48, and 84 will be near the steady state voltage $V_M$, and voltage $V_M$ will be approximately equal to the voltage on the reference circuit node 24 labeled "$V_{B1REF}$". Accordingly, the precharge operation must change the voltage on nodes 46, 48, and 84 from $V_{DD}$ to $V_{B1REF}$. Thus, the charge required is $$Q_{SA} = C_{SA}(\Delta V) = C_{SA}(V_{DD} - V_{B1REF})$$

where $C_{SA}=C_M+C_O+C_{OR}$. The precharge circuit 13' will store this excess charge ($Q_{SA}$) on capacitor 104 ($C_{DEC}$). The total charge stored on capacitor 104 before precharging is $$Q_{DEC}=C_{DEC}(V_{DD}-V_{B1})$$

The charge $Q_{DEC}$ will also be equal the total charge required after charge sharing, that is $$Q_{DEC}=(C_{DEC}+C_{SA})(V_{DD}-V_{B1REF})$$

and $$(V_{DD}-V_{B1})/(V_{DD}-V_{B1REF})=(C_{DEC}+C_{SA})/C_{DEC}$$

Therefore, the ratio of resistances is set according to the equality $$(R_{112}+R_{111})/R_{111}=((C_{DEC}+C_{SA})/C_{DEC})$$

Referring to FIG. 3, at time t0, sense circuit 14' is enabled when AMPEN transitions high. PRECHARGE-S becomes a logic high and PRECHARGE-S* becomes a logic low. Likewise, PRECHARGE-B becomes a logic high and PRECHARGE-B* becomes a logic low. Transmission gates 109 and 110 become substantially non-conductive and transmission gates 80, 81, 82, and 83 become conductive, allowing charge to be shared between capacitor 104 and the capacitance of nodes 46, 48, and 84, and allowing charge to be shared between capacitor 105 and the capacitance of nodes 54 and 64. Also, at time t0, signal EQ transitions to cause transmission gates 50 and 85 to become conductive, thus insuring the nodes 46, 48, and 84 are at the same common mode voltage. At time t1, PRECHARGE-B transitions low to make transmission gates 81–83 substantially non-conductive and causing transmissions gate 110 to be conductive, thus recharging capacitor 105. Likewise, at time t2, PRECHARGE-S transitions low causing transmission gate 80 to be non-conductive and causing transmission gate 109 to be conductive to recharge capacitor 104. At time t3, EQ becomes low again, turning off transmission gates 50 and 85. The precharge portion of the read cycle is complete at this point and the voltages at nodes 48 and 84 are allowed to separate, thus indicating the stored state of memory cell 77. At time t4, the read cycle ends when AMPEN transitions low to disable sense circuit 14'.

Setting the precharge voltage to compensate for the ratio of internal node capacitances decreases the time required to precharge the internal nodes of the sense amplifier to steady state common mode voltages. Reducing the time required to precharge the sense amplifier provides the benefit of faster read operations. Also, setting the precharge voltage to compensate for the ratio of internal node capacitances provides the additional benefit of a more accurate precharge of the sensing circuit 14' and delivers the state of the sensing circuit 14' to steady state operation with smaller decoupling capacitances than the prior art sensing circuit 14 of FIG. 1.

Various changes and modifications to the embodiments herein chosen for purposes of illustration will readily occur to those skilled in the art. For example, variations in the types of conductivities of transistors, the types of transistors, etc. may be readily made. Also, the illustrated embodiment has been discussed in the context of an MRAM. However, the illustrated embodiment may apply to other memory types as well. To the extent that such modifications and variations do not depart from the spirit of the invention, they are intended to be included within the scope thereof which is assessed only by a fair interpretation of the following claims.

What is claimed is:

1. A sense amplifier, comprising:
   a current mirror circuit having a first current path for conducting a current from a selected memory cell, and a second current path for conducting a current from a reference cell; and
   a precharge circuit for selectively precharging at least a portion of the first and second current paths to a predetermined voltage, the precharge circuit comprising an operational amplifier having a first input for receiving a reference voltage, a second input, and an output for providing a precharge voltage, the output coupled to the second input through a voltage divider circuit.

2. The sense amplifier of claim 1 wherein the voltage divider circuit comprises:
   a first resistive element having a first terminal coupled to a power supply voltage terminal, and a second terminal coupled to the second input of the operational amplifier, the first resistive element having a first resistance value; and
   a second resistive element having a first terminal coupled to the second input of the operational amplifier, and a second terminal coupled to the output of the operational amplifier, the second resistive element having a second resistance value.

3. The sense amplifier of claim 2, wherein a ratio of the first resistance value to a second resistance value controls an amount of charge that is shared between the output of the operational amplifier and the at least a portion of the first and second current paths, and wherein the charge sharing is for precharging the at least a portion of the first and second current paths.

4. The sense amplifier of claim 2, wherein the resistance value of the first resistive element is user programmable.

5. The sense amplifier of claim 2, wherein the first resistive element is a resistor having the first resistance value and the second resistive element is a resistor having the second resistance value, and wherein a ratio of the first resistance value to the second resistance value is at least partially dependant on a ratio of a first capacitance to a second capacitance, wherein the first capacitance is associated with the first and second current paths and the second capacitance is associated with the output of the operational amplifier.

6. The sense amplifier of claim 5, wherein the second capacitance is provided by a capacitor coupled to the output of the operational amplifier.

7. The sense amplifier of claim 1, further comprising:
   a first switch having a first terminal coupled to the output of the operational amplifier, a second terminal, and a control terminal for receiving a first precharge control signal;
   a capacitor having a first plate electrode coupled to a power supply voltage terminal, and a second plate electrode coupled to the second terminal of the first switch; and
   a second switch having a first terminal coupled to the second terminal of the first switch, a second terminal coupled to the first and second current paths, and a control terminal for receiving a second precharge signal.

8. The sense amplifier of claim 7, wherein the first and second switches are transmission gates.

9. The sense amplifier of claim 1 further comprising a reference circuit for providing the reference signal, the reference circuit comprising:

a second operational amplifier having a first input for receiving a reference signal, a second input, and an output for providing a bias voltage;

a current source having a first terminal coupled to a first power supply voltage terminal, and a second terminal;

a transistor having a first current electrode coupled to the second terminal of the current source, a control electrode coupled to the output of the second operational amplifier, and a second current electrode;

a first reference cell having a first terminal coupled to the second current electrode of the transistor, and a second current electrode coupled to a second power supply voltage terminal, the first reference cell having a resistance representative of a resistance of memory cell programmed to a high state; and a second reference cell having a first terminal coupled to the second current electrode of the transistor, and a second current electrode coupled to the second power supply voltage terminal, the second reference cell having a resistance representative of a resistance of memory cell programmed to a low state.

10. The sense amplifier of claim 1, further comprising an equalization circuit for causing the first and second current paths to be equalized to the predetermined voltage.

11. The sense amplifier of claim 1, wherein the selected memory cell is a magnetoresistive random access memory cell.

12. The sense amplifier of claim 1, further comprising a third current path for conducting a current from a second reference cell, wherein the reference cell has a first resistance representative of a resistance of a memory cell programmed to a high resistance state, and the second reference cell has a second resistance representative of a resistance of the memory cell programmed to a low resistance state.

13. A sense amplifier, comprising:
a sense circuit for sensing and amplifying a signal on a selected bit line, the signal representative of a logic state stored by a memory cell coupled to the selected bit line;

an enable circuit, coupled to the sense circuit, for enabling operation of the sense circuit in response to an enable signal; and a precharge circuit, coupled to the sense circuit, for precharging a node of the sense circuit to a predetermined voltage in response to a precharge signal, the precharge circuit comprising an operational amplifier having a first input for receiving a reference voltage, a second input, and an output for providing the precharge voltage, wherein the output is coupled to the second input via a voltage divider circuit.

14. The sense amplifier of claim 13, wherein the voltage divider comprises:
a first resistive element having a first terminal coupled to a power supply voltage terminal, and a second terminal coupled to the second input of the operational amplifier; and a second resistive element having a first terminal coupled to the second input of the operational amplifier, and a second terminal coupled to the output of the operational amplifier.

15. The sense amplifier of claim 14, wherein a ratio of a first resistance value of the first resistive element to a second resistance value of the second resistive element controls an amount of charge that is shared between the output of the operational amplifier and the node of the sense circuit, the charge sharing for precharging the node.

16. The sense amplifier of claim 14, wherein a resistance value of the first resistive element is user programmable.

17. The sense amplifier of claim 14, wherein the first resistive element is a resistor having a first resistance value and the second resistive element is a resistor having a second resistance value, and wherein a ratio of the first resistance value to the second resistance value is at least partially dependant on a ratio of a first capacitance to a second capacitance, wherein the first capacitance is associated with the node and the second capacitance is associated with the output of the operational amplifier.

18. The sense amplifier of claim 13, further comprising a capacitive element coupled to the precharge circuit, wherein the precharge circuit is for charging the capacitive element, the capacitive element for storing charge that is used to precharge the sense circuit.

19. The sense amplifier of claim 13, further comprising:
a first switch having a first terminal coupled to the output of the operational amplifier, a second terminal, and a control terminal for receiving a first precharge control signal;

a capacitor having a first plate electrode coupled to a power supply voltage terminal, and a second plate electrode coupled to the second terminal of the first switch; and a second switch having a first terminal coupled to the second terminal of the first switch, a second terminal coupled to the node, and a control terminal for receiving a second precharge signal.

20. The sense amplifier of claim 19, wherein the first and second switches are transmission gates.

21. The sense amplifier of claim 13, wherein the sense circuit comprises a current mirror circuit having a first current path for conducting a current from a selected memory cell, a second current path for conducting a current from a first reference cell, the first reference cell having a first resistance representative of a resistance valve of a memory cell programmed to a high resistance state, and a third current path of conducting a current from a second reference cell, the second reference cell having a second resistance representative of a resistance valve of the memory cell programmed to a low resistance state.

22. The sense amplifier of claim 13, wherein the memory cell is magnetoresistive random access memory cell.

23. A method for sensing a logic state stored in a memory cell comprising:
providing a precharge circuit;

storing charge on a capacitive element using the precharge circuit;

enabling operation of a sense amplifier, the sense amplifier for sensing the logic state stored in the memory cell;

decoupling the capacitive element from the precharge circuit;

precharging the sense amplifier to a predetermined voltage by causing charge to be shared between the capacitive element and the sense amplifier; and sensing the logic state stored in the sense amplifier.

24. The method of claim 23, wherein providing a precharge circuit further comprises providing a precharge circuit having an operational amplifier having a first input for receiving a reference voltage, a second input, and an output coupled to the second input through a voltage divider.

25. The method of claim 23, wherein the memory cell is a magnetoresistive random access memory cell.

26. The method of claim 23, wherein the sense amplifier comprises a first current path for conducting a current from a selected memory cell, a second current path for conducting a current from a first reference cell, the first reference cell having a first resistance representative of a resistance valve of a memory cell programmed to a high resistance state, and a third current path of conducting a current from a second reference cell, the second reference cell having a second resistance representative of a resistance valve of the memory cell programmed to a low resistance state.

27. The method of claim 23, wherein the sense amplifier comprises a first current path for conducting a current from a selected memory cell, and a second current path for conducting a current from a reference cell.

* * * * *